(12) United States Patent
Shin et al.

(10) Patent No.: US 6,571,384 B2
(45) Date of Patent: May 27, 2003

(54) METHOD OF FORMING FINE PATTERNS ON SEMICONDUCTOR DEVICE

(75) Inventors: Hye-Soo Shin, Seoul (KR); Suk-Joo Lee, Yongin-si (KR); Jeung-Woo Lee, Suwon-si (KR); Dae-Youp Lee, Gunpo-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 28 days.

(21) Appl. No.: 09/847,290

(22) Filed: May 3, 2001

(65) Prior Publication Data

US 2002/0059557 A1 May 16, 2002

(30) Foreign Application Priority Data

Nov. 13, 2000 (KR) .......................... 2000-67079

(51) Int. Cl.[7] .............................. G06F 17/50
(52) U.S. Cl. .................... 716/21; 716/19; 716/20; 438/551; 438/708; 438/736; 438/717; 438/975
(58) Field of Search .................. 716/19, 1, 21; 438/708, 736, 551, 553, 671, 717, 975, 950, 692, 738, 743, 552, 555

(56) References Cited

U.S. PATENT DOCUMENTS

| 6,080,674 | A | * | 6/2000 | Wu et al. | 438/692 |
| 6,184,151 | B1 | * | 2/2001 | Adair et al. | 438/736 |
| 6,294,295 | B1 | * | 9/2001 | Lin et al. | 716/20 |
| 6,312,855 | B1 | * | 11/2001 | Hwang et al. | 716/21 |
| 6,362,113 | B1 | * | 3/2002 | Wang | 438/738 |
| 6,370,441 | B1 | * | 4/2002 | Ohnuma | 716/21 |
| 6,395,636 | B1 | * | 5/2002 | Hanson | 438/692 |
| 2002/0004175 | A1 | * | 1/2002 | Levenson | 716/21 |
| 2002/0025478 | A1 | * | 2/2002 | Inazuki et al. | 716/19 |
| 2002/0058187 | A1 | * | 5/2002 | Usui et al. | 716/19 |
| 2002/0098424 | A1 | * | 7/2002 | Cutter et al. | 716/19 |

FOREIGN PATENT DOCUMENTS

KR    1999-015462    3/1999

* cited by examiner

*Primary Examiner*—Steven Loke
*Assistant Examiner*—Quang Vu
(74) *Attorney, Agent, or Firm*—Volentine Francos, PLLC

(57) ABSTRACT

A method of forming fine patterns in a semiconductor device through a double photo lithography process. A layer to be etched and a hard mask layer are sequentially formed on a semiconductor substrate. A first photo resist pattern is formed on the hard mask layer. A first hard mask layer pattern is formed by etching the hard mask layer using the first photo resist pattern. After the first photo resist pattern is removed, a second photo resist pattern is formed on the resultant structure. A second hard mask layer pattern is formed by etching the first hard mask layer pattern using the second photo resist pattern. The layer to be etched is then etched using the second hard mask layer pattern after the second photo resist pattern has been removed, resulting in patterns have line edges without rounding.

13 Claims, 15 Drawing Sheets

METHOD OF FORMING FINE PATTERNS ON SEMICONDUCTOR DEVICE

BACKGROUND OF THE INVENTION

1. Field of the Invention

The present invention relates to a method of forming fine patterns in a semiconductor device, and more particularly, to a method of forming fine patterns which can prevent distal ends of the lines (i.e, line edges) of the fine pattern from being rounded off.

2. Description of the Related Art

The various patterns in a semiconductor device are formed by a sequence or series of various photolithography techniques. The photolithography techniques generally include steps of: (a) forming a photo resist layer on an insulating or conductive layer; (b) irradiating the photo resist layer with X-ray or ultraviolet light through a pre-defined pattern to alter the solubility thereof; (c) forming a photo resist pattern by removing portions having a higher solubility by developing the exposed photo resist layer after exposing predetermined portions of the photo resist layer to the designated light source; and (d) and forming various patterns such as electrical wirings or electrodes by etching the exposed portions of the layer where the pattern is formed.

FIGS. 1A and 1B are plan views illustrating a method of forming patterns in a semiconductor device according to a conventional lithography process. FIG. 1A is a plan view partially showing the photo mask for forming an island type rectangular pattern on a semiconductor substrate. A light masking (or shielding) layer pattern 12 is formed on a transparent mask substrate 10, with the light masking layer pattern 12 having a rectangular shaped island type pattern.

With the conventional method of forming a pattern, a photo resist pattern is formed by exposing the photo mask to light to change the solubility of the photo resist layer, and then developing this photo resist layer that is coated on a wafer (i.e., a semiconductor substrate) to create the pattern. However, during the exposure process, the line edges or distal ends 12a of the light masking layer pattern experience a three-dimensional optical diffraction phenomenon. As shown in FIG. 1B, the 3-D optical diffraction causes the line edges or distal ends 12a to be rounded, such that the rectangular photo resist pattern 22 fails to form the desired rectangular pattern on the semiconductor substrate 20.

This 3-D phenomenon is called the optical proximity effect, and periodic grain type patterns, such line/space patterns ("L/S patterns") are only affected slightly by the optical proximity effect. However, the operation of island patterns, such as a capacitor electrode of dynamic random access memory (DRAM) or a gate electrode of static random access memory (SRAM), are seriously affected by the rounding of the distal ends or line edges of the pattern due to the optical proximity effect.

In particular, the rounding becomes more serious as the design rule decreases since the size of the pattern is reduced and the processing margin greatly decreases. For example, in case of a gate electrode of a SRAM device, the rounding of the line edges is about 70 nm when the extension is about 100 nm with respect to an active region of an underlying layer. Therefore, the processing margin deteriorates and leakage current increases since the overlap margin is only about 30 nm, which is insufficient for the active region of the gate electrode.

In an effort to prevent the rounding of line edges of the pattern, a phase shift mask (PSM) which shifts the phase of the incident light is utilized. Also, a feed type light proximity compensation method may be employed. In this method, a subsidiary pattern having a bar shape is formed at the portion of the light masking layer pattern of the photo mask where the rounding occurs.

In case of the phase shift mask, since the light passing through the phase shift layer has a phase opposed to that of the light passing over others regions of the phase shift mask, the contrast of the pattern image can be increased by utilizing the diffraction phenomenon of the light, but the rounding of the line edges of the pattern cannot be completely eliminated.

As for the feed type light proximity compensation method, the overlap margin can be increased slightly by enhancing the rounding of about 30 to 40 nm when it is applied to the pattern under a 0.15 μm design rule, however, the improvement of the rounding may be limited in case where pattern has a 0.12 μm design rule.

Therefore, several methods of forming the pattern through a double exposure process using two photo masks are used to try and improve the rounding of the line edges of the pattern.

FIGS. 2A to 2D are cross-sectional views and plan views illustrating a method of forming fine patterns in a semiconductor device by the conventional double exposing process disclosed in Korean Patent Laid-Open Publication No. 1999-015462 (Korean Patent Application No. 1997-037588).

FIG. 2A is a cross-sectional view of a photo resist layer 54 on a semiconductor substrate 50 having a layer 52 to be etched thereon for forming a pattern. FIG. 2B is a plan view of the photo resist layer 54 being exposed through a first photo mask having longitudinally extending patterns 54a formed thereon. FIG. 2C is a plan view of the photo resist layer 54 being exposed through a second photo mask having laterally extending patterns 54b formed thereon. FIG. 2D is a cross-sectional view taken along the line of 2—2 in FIG. 2C showing the resulting photo resist pattern 54c formed by developing the photo resist pattern 54. Thereafter, the desired pattern is formed on the semiconductor substrate 50 after etching the layer to be etched 52 by using the photo resist pattern 54c as an etching mask.

While the conventional double exposing method can prevent the optical diffraction phenomenon, the rounding of the pattern is still generated during the double exposure process since the latent image is overlapped in the region where the first exposed pattern 54a and the second exposed pattern 54b intersect each other.

SUMMARY OF THE INVENTION

It is therefore a first objective of the present invention to provide a method of forming fine patterns in a semiconductor device, which can prevent the rounding of the line edges of the pattern.

It is a second objective of the present invention to provide a method of simultaneously forming fine patterns comprising a line/space pattern and an island type pattern in a semiconductor device, which can prevent the rounding of the line edges of fine pattern.

To accomplish the first objective of the present invention, one preferred embodiment of the present invention provides a method of forming fine patterns as follows. First, a layer to be etched for forming a main pattern is formed on a semiconductor substrate and then a hard mask layer is formed on the layer to be etched. A first hard mask layer pattern, defining a first peripheral portion of the main pattern in a first direction, is formed by patterning the hard mask layer. Then a second hard mask layer pattern, defining the first and a second peripheral portion of the main pattern in the first and second directions, is formed by patterning the first hard mask layer pattern, the second hard mask layer pattern being identical to the main pattern. Thereafter, the main pattern is formed by etching the layer to be etched using the second hard mask layer pattern.

The first hard mask layer pattern is formed by forming a first photo resist pattern on the hard mask layer to define the first peripheral portion of the main pattern in the first direction and by etching the hard mask layer by using the first photo resist pattern.

The second hard mask layer pattern is formed by forming a second photo resist pattern on the resultant structure, including the first hard mask layer pattern, to define the second peripheral portion of the main pattern in the second direction and by etching the first hard mask layer pattern by using the second photo resist pattern. Preferably, the hard mask layer is composed of a material having an etching selectivity higher than that of the layer to be etched during etching process.

Also, to accomplish the first objective of the present invention, another preferred embodiment of the present invention provides a method of forming fine patterns in a semiconductor device wherein a layer to be etched is formed on a semiconductor substrate for forming a main pattern. Then, a hard mask layer is formed on the layer to be etched and then a first photo resist layer is coated on the hard mask layer. A first photo resist pattern is formed through exposing and developing the first photo resist layer by using a first photo mask having a first light masking layer pattern extending in a first direction. A first hard mask layer pattern is formed by etching the hard mask layer using the first photo resist pattern. After removing the first photo resist pattern, a second photo resist layer is coated on the resultant structure including the first hard mask layer pattern. A second photo resist pattern is formed through exposing and developing the second photo resist layer by using a second photo mask having a second light masking layer pattern extending in a second direction perpendicular to the first direction. A second hard mask layer pattern identical to the main pattern is formed by etching the first hard mask layer pattern using the second photo resist pattern. After removing the photo resist pattern, the main pattern is formed by etching the layer to be etched using the second hard mask layer pattern.

To achieve the second objective of the present invention, still another preferred embodiment of the present invention provides a method of simultaneously forming fine patterns comprising a line/space pattern and an island type pattern in a semiconductor device. In this method, a layer to be etched is formed on a semiconductor substrate for forming a main fine pattern. A hard mask layer is formed on the layer to be etched and a first photo resist pattern is formed on the hard mask layer, the first photo resist pattern being patterned to form the line/space pattern in a first region where the line/space pattern is formed and extending along a first direction into a second region where the island pattern is formed. Then, a first hard mask layer pattern is formed by etching the hard mask layer using the first photo resist pattern. After removing the first photo resist pattern, a second photo resist pattern is formed on the resultant structure including the first hard mask layer pattern, the second photo resist pattern being patterned to form the line/space pattern in the first region and extending into the second region along a second direction perpendicular to the first direction. Thereafter, a second hard mask layer pattern identical to the main fine pattern is formed by etching the first hard mask layer pattern using the second photo resist pattern. After removing the second photo resist pattern, the main fine pattern is formed by etching the layer to be etched using the second hard mask layer pattern.

According to the present invention, after the first hard mask layer pattern is formed by primarily etching the hard mask layer through the first lithography process, the second hard mask layer pattern is formed by secondarily etching the hard mask layer through the second lithography process. Therefore, the portion of the pattern where the rounding is generated can be cut twice by the double lithography processes, however, the first and second latent images cannot be overlapped since the second photo resist pattern is formed after the first photo resist pattern is removed.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Hereinafter, the present invention will now be described more fully with reference to the accompanying drawings, in which preferred embodiments of the present invention are shown.

FIGS. 3 to 9B are cross-sectional views and plan views for illustrating a method of forming fine patterns in a semiconductor device according to one preferred embodiment of the present invention.

Figure 1A:
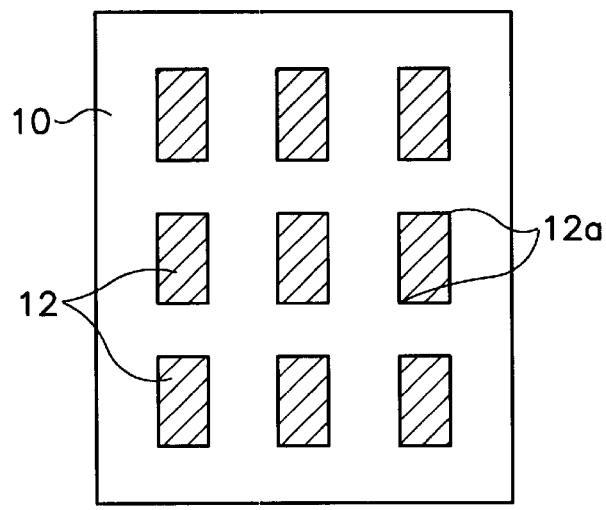
FIGS. 1A and 1B are plan views illustrating a method of forming a pattern in a semiconductor device according to a conventional lithography process.
Figure 1B:
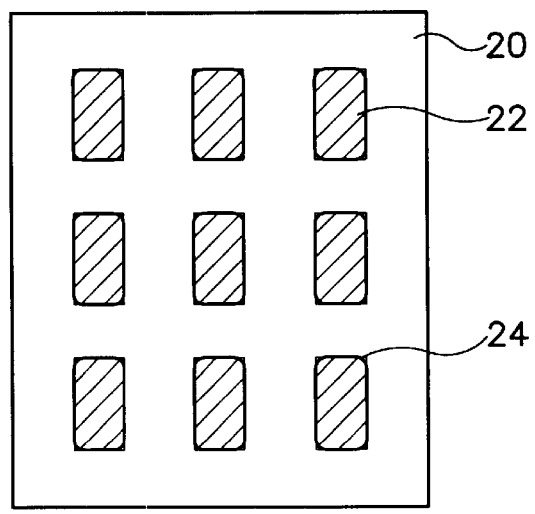
Figure 2A:
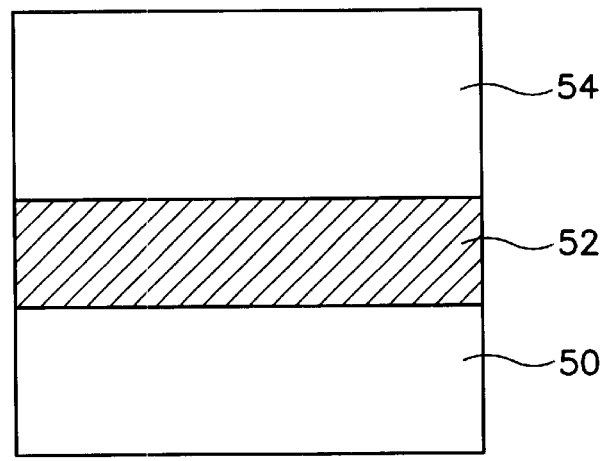
FIGS. 2A to 2D are respective cross-sectional views and plan views showing a method of forming a pattern in a semiconductor device according to a conventional double exposure process.
Figure 2B:
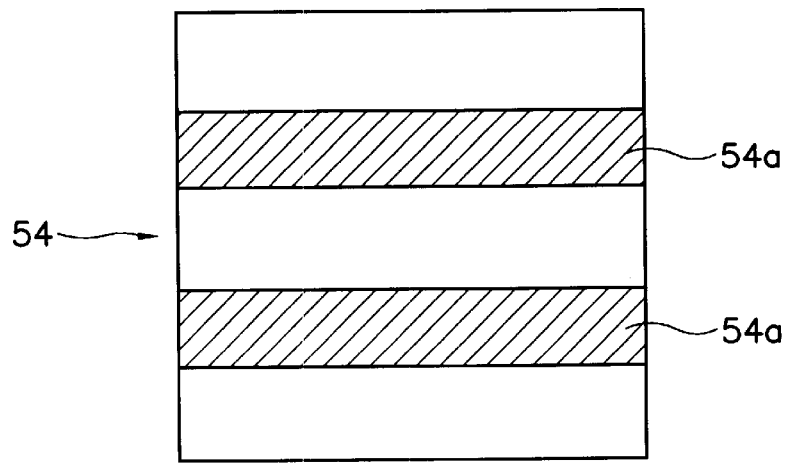
Figure 2C:
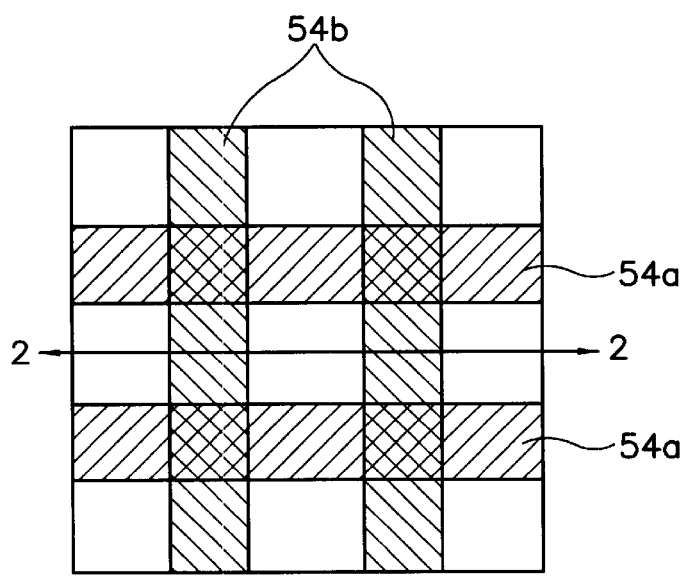
Figure 2D:
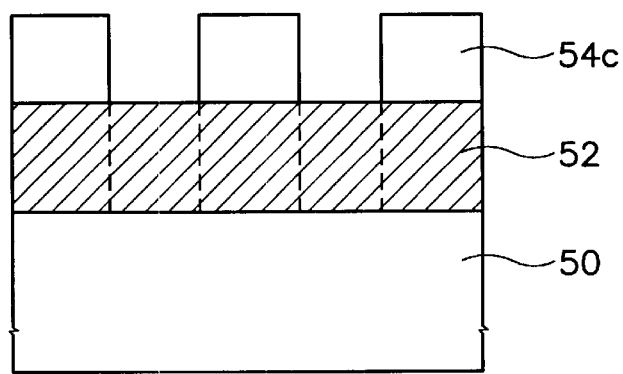
Figure 3:
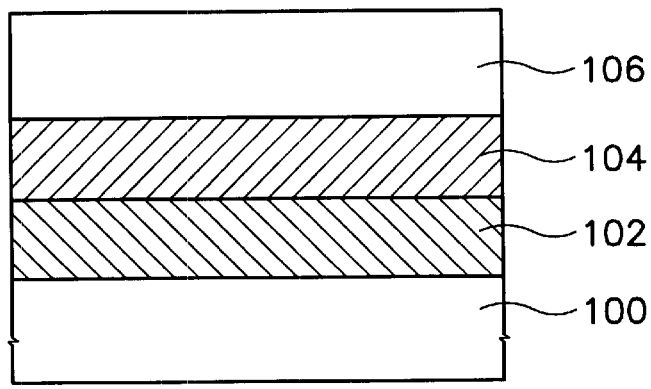
FIGS. 3 to 9B are respective cross-sectional views and plan views illustrating a method of forming fine patterns in a semiconductor device according to a preferred embodiment of the present invention.

FIG. 3 is a cross-sectional view illustrating a step of coating a first photo resist layer. After a layer 102 to be etched for forming a main pattern is formed on a semiconductor substrate 100, a hard mask layer 104 having a thickness of about 1000 Å is formed on the layer 102 to be etched. The hard mask layer 104 is formed by using a material having an etching selectivity higher than that of the layer 102 to be etched for any etching process. For example, when the layer 102 to be etched is comprised of polysilicon or metal silicide, the hard mask layer 104 is comprised of silicon oxide (SiO2), silicon nitride (SixNy) or silicon oxynitride (SiOxNy). Subsequently, a first photo resist layer 106 is coated on the hard mask layer 104 by a spin coating method or other equivalent method.

Figure 4A:
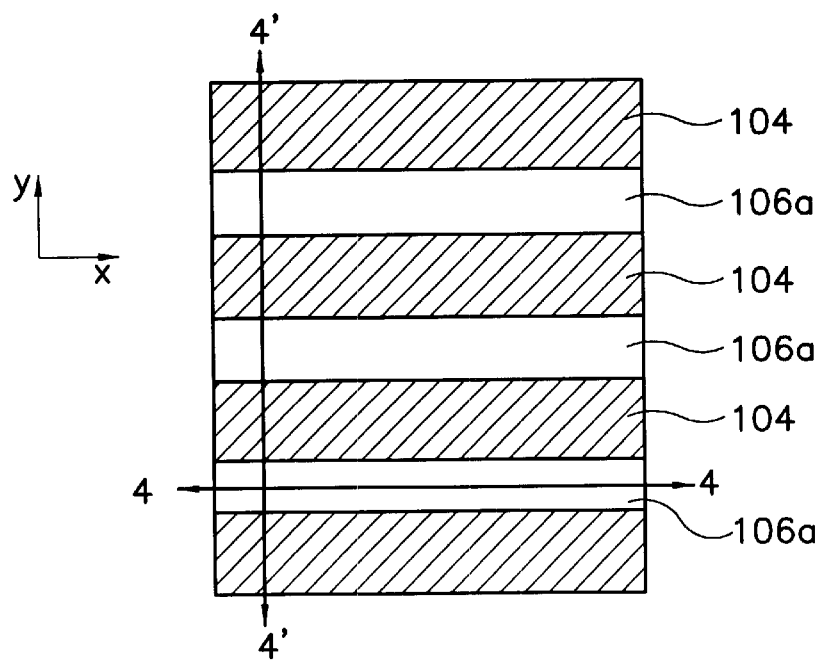
Figure 4B:
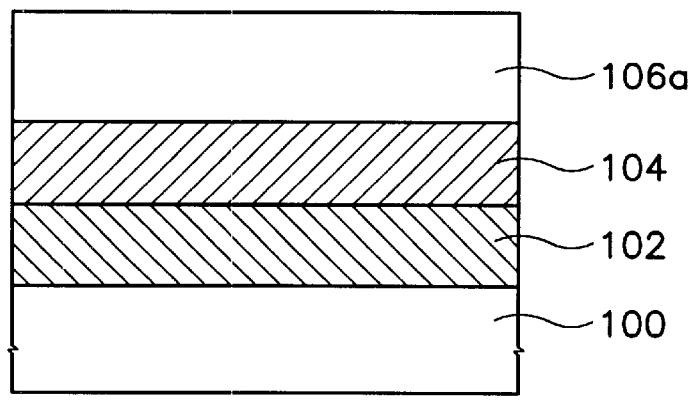
Figure 4C:
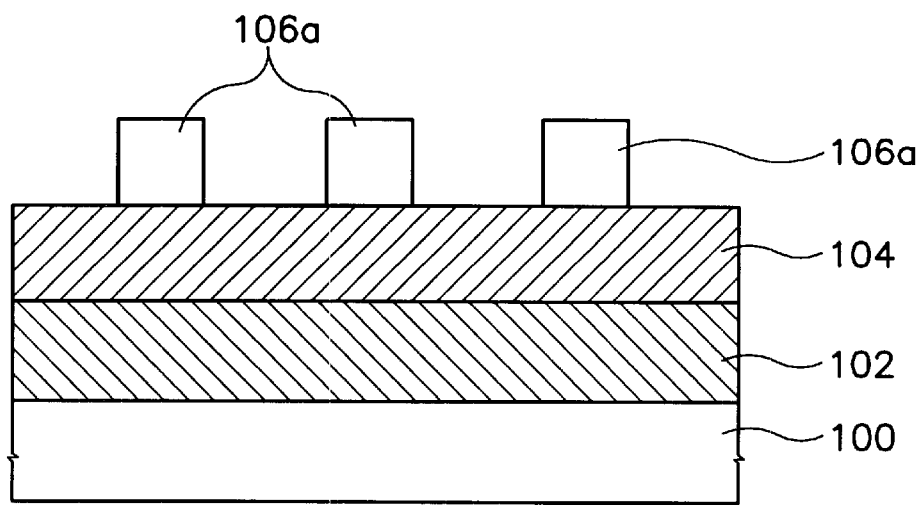

FIG. 4A is a plan view showing the first photo resist layer 106 after the first photo resist layer 106 is exposed and developed to create the first photo resist pattern 106a. The resulting first photo resist pattern 106a can be seen in FIG. 4B, which is a cross-sectional view taken along the line of 4—4 in FIG. 4A, and in FIG. 4C, which is a cross-sectional view taken along the line of 4'—4' in FIG. 4A.

Figure 4D:
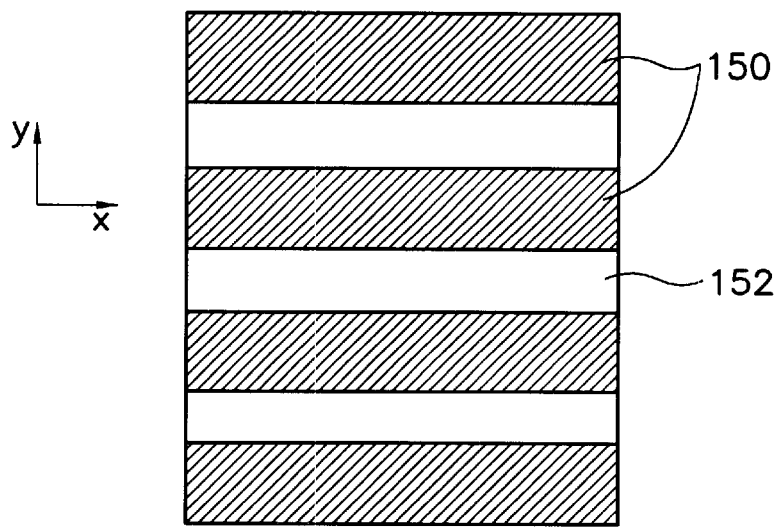

As shown in FIG. 4D, the first photo resist layer 106 is exposed by using a first photo mask 150, formed on the first photo resist layer 106, having a first light masking layer pattern 152 extending in a first direction, for example the horizontal direction (i.e., lateral or 'x' direction) so as to define a first peripheral portion of the main pattern in the first direction. Subsequently, when the exposed portion of the first photo resist layer 106 is removed by a developing process, a first photo resist pattern 106a extending along the first direction is formed as shown in FIG. 4A.

Preferably, the light masking layer pattern 152 of the first photo mask 150 has a width corresponding to the y-directional length (i.e., vertical or longitudinal direction) of the pattern (see also reference numeral 102a in FIG. 9A) formed on the semiconductor substrate 100. Preferably, the light masking layer pattern 152 of the first photo mask 150 also has a length longer than the x-directional width of the pattern formed on the semiconductor substrate 100 so that the light masking layer pattern 152 of the first photo mask 150 has a striped pattern extending left and right along the x-direction and centered about the pattern.

Figure 5A:
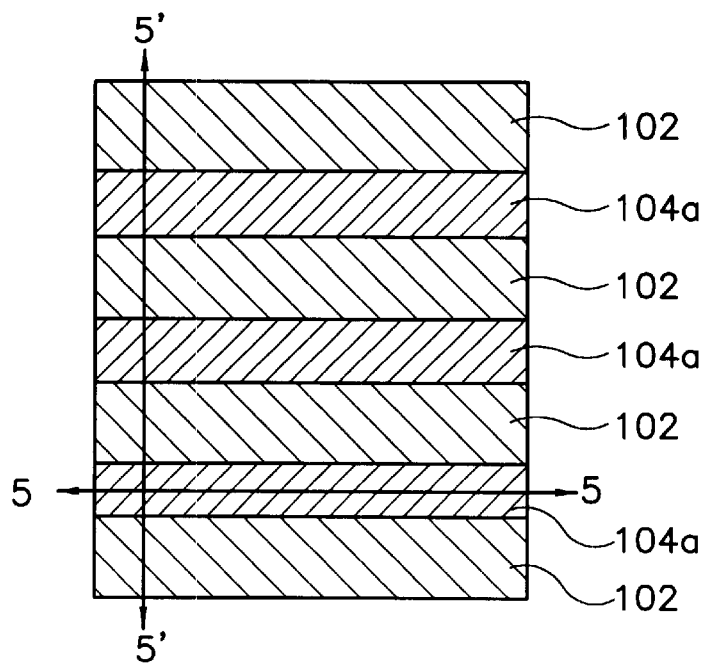
Figure 5B:
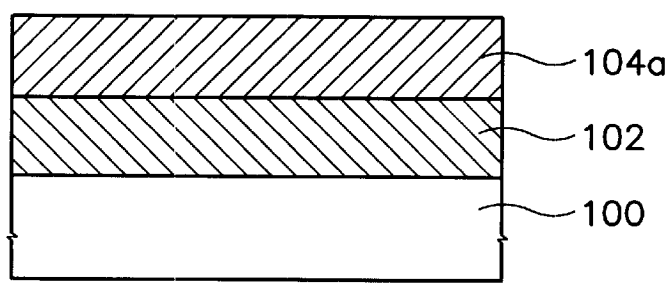
Figure 5C:
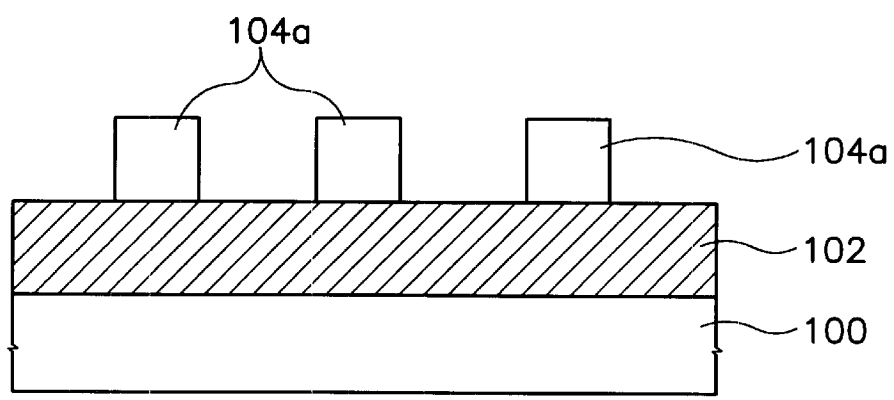

FIG. 5A is a plan view showing the resulting etched hard mask layer 104 and FIGS. 5B and 5C are cross-sectional views taken along the lines 5—5 and 5'—5', respectively, of FIG. 5A. The hard mask layer 104 is primarily etched using the first photo resist pattern 106a as an etching mask. The first photo resist pattern 106a is then removed by ashing and striping processes after the first hard mask layer pattern 104a is formed. The resulting first hard mask layer pattern 104a defines the first peripheral portion of the main pattern in the first direction. The first hard mask layer pattern 104a extends in the first direction, i.e, in the horizontal direction.

Figure 6A:
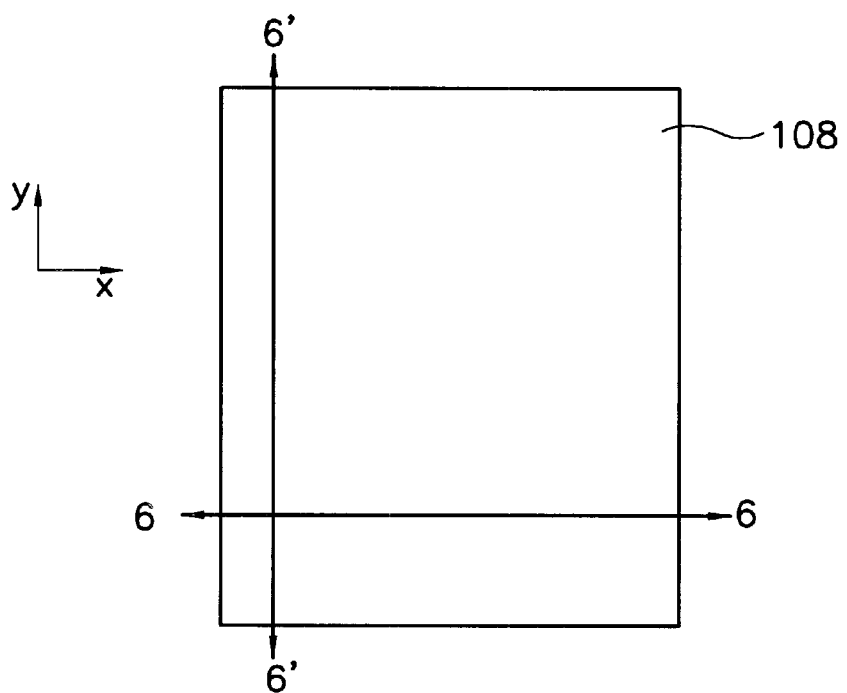
Figure 6B:
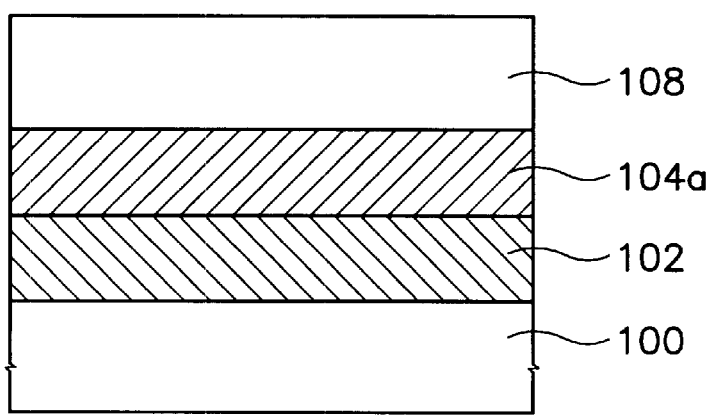
Figure 6C:
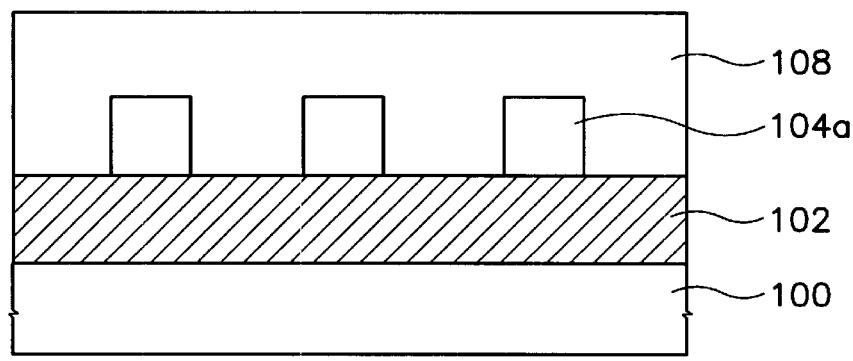

After the first photo resist pattern 106a is removed, a second photo resist layer 108 is coated on the resultant structure by, for example, a spin coating or other equivalent method. FIG. 6A is a plan view showing the resultant structure after the second photo resist layer 108 is coated thereon, and FIGS. 6B and 6C are cross-sectional views taken along the lines of 6—6 and 6'—6' respectively, of FIG. 6A.

Figure 7A:
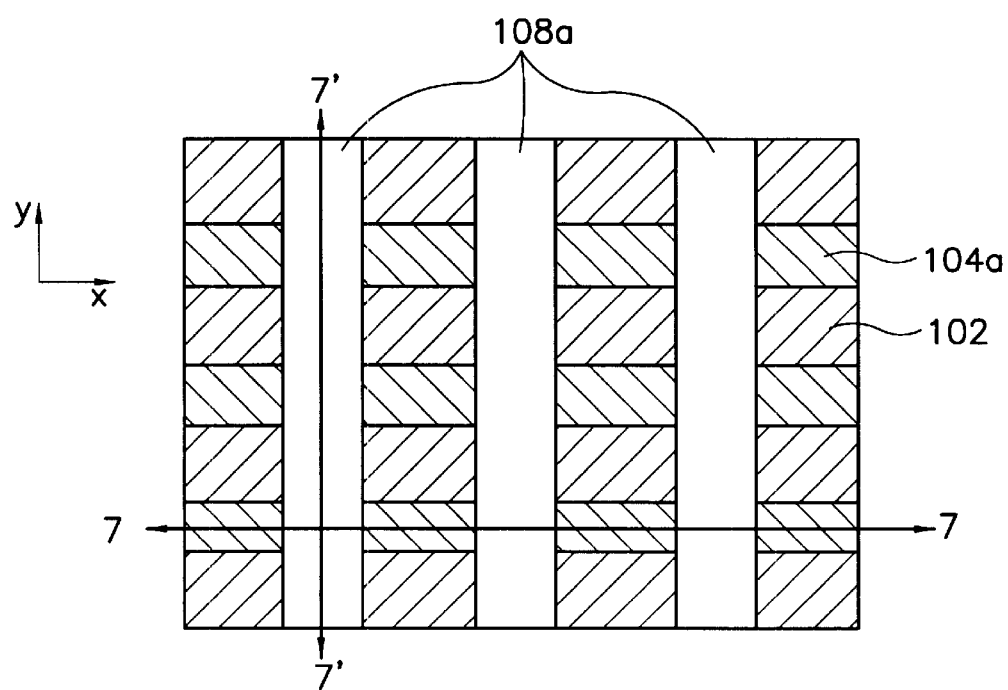
Figure 7B:
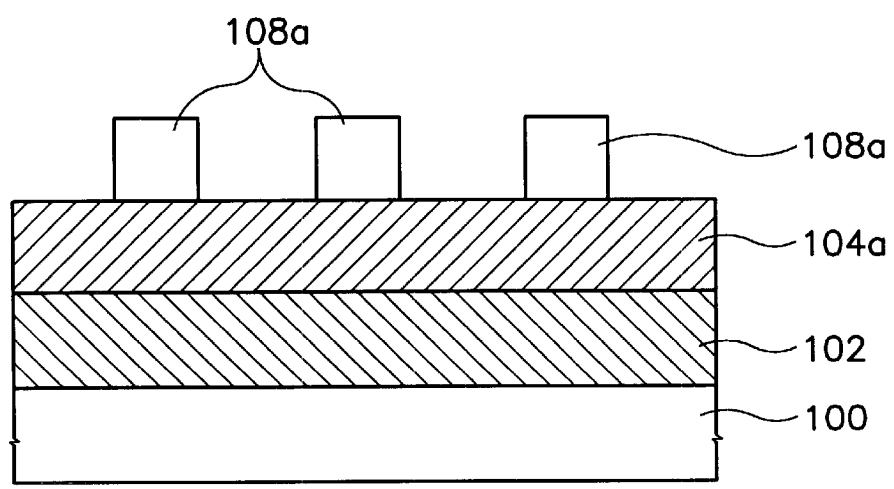
Figure 7C:
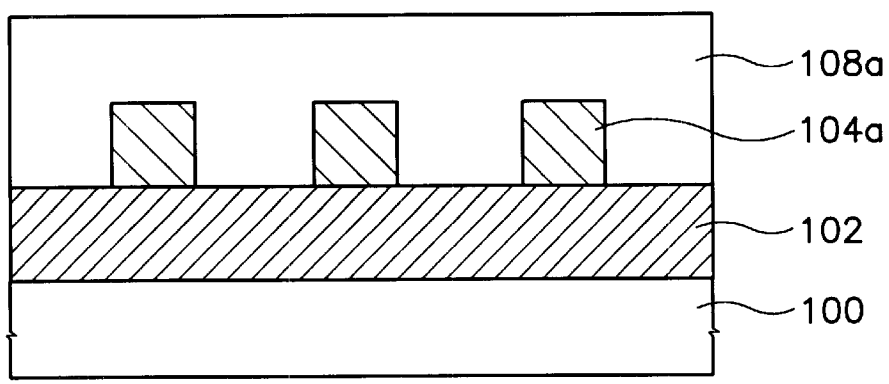

FIG. 7A is a plan view showing the second photo resist layer 108 after the second photo resist layer 108 is exposed and developed, and FIGS. 7B and 7C are cross-sectional views taken along the lines 7—7 and 7'—7' respectively, of FIG. 7A.

Figure 7D:
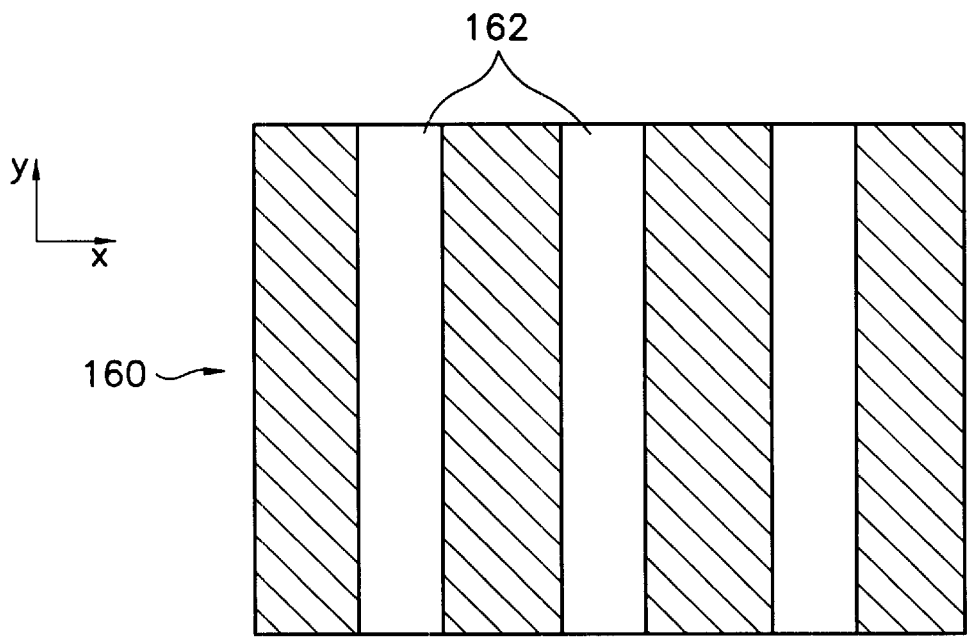

As shown in FIG. 7D, in order to define a second peripheral portion of the main pattern in a second direction, the second photo resist layer 108 is exposed using a second photo mask 160 having a second light masking pattern 162 extending in a second direction perpendicular to the first direction, for example, the vertical or y-direction. Note that the first photo mask 150 may be identical or different from the second photo mask 160, depending on the desired resulting pattern. If the first photo mask 150 is identical to the second photo mask 160, the second photo mask 160 having the second light masking layer pattern 162 can be obtained by rotating the first photo mask 150 by an angle of about 90 degrees. Hence, the second light masking layer pattern 162 is approximately perpendicular to the first light masking layer pattern 152 of the first photo mask 150. Preferably, the second light masking layer pattern 162 of the second photo mask 160 has a width corresponding to the x-directional length of the pattern (see reference numeral 102a in FIG. 9A) formed on the semiconductor substrate 100. Preferably, the second light masking layer pattern 162 of the second photo mask 160 should have a length longer than the x-directional width of the pattern formed on the semiconductor substrate 100 so that the second light masking layer pattern 162 has a striped pattern extending up and down in the y-direction and centered about the pattern.

When the exposed portion of the second photo resist layer 108 is removed by the developing process, a second photo resist pattern 108a extending in the second direction is formed so as to define the second peripheral portion of the main pattern in the second direction as shown in FIG. 7A. In the present invention, since the second photo resist pattern 108a is formed after the first photo resist pattern 106a, the latent image generated during the first primary exposure cannot overlap the second photo resist pattern 108a.

Figure 8A:
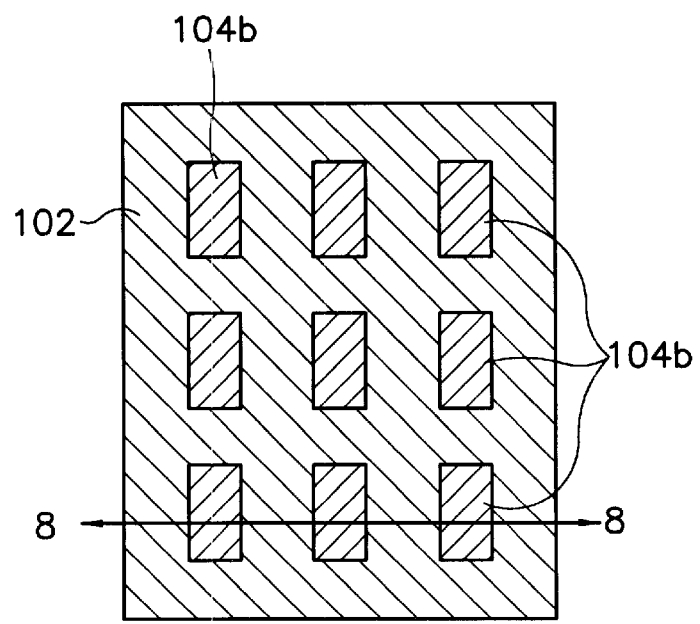
Figure 8B:
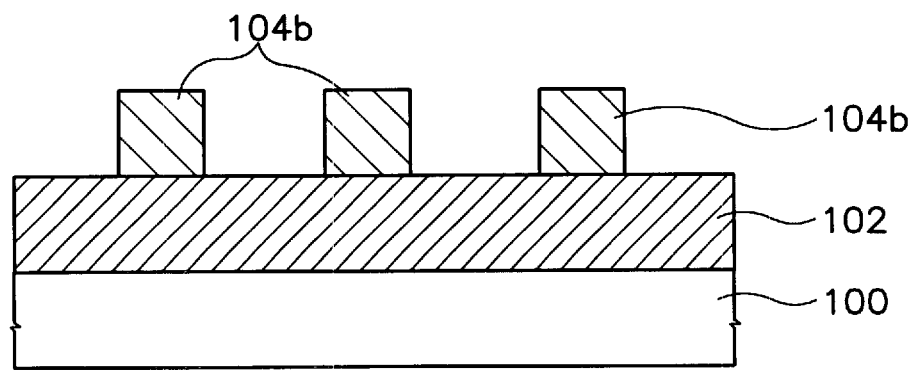

FIG. 8A is a plan view showing the resultant structure after the hard mask layer 104 is secondarily etched and FIG. 8B is a cross-sectional view taken along the line 8—8 in FIG. 8A. The first hard mask layer pattern 104a is secondarily etched using the second photo resist pattern 108a as an etching mask. Then, a rectangular second hard mask layer pattern 104b identical to the main pattern is formed as shown in FIG. 8A.

In general, the rounding of the edges of the pattern can be prevented when the pattern includes stripes periodically formed such as with a line/space pattern. With regard to the line edges of the island patterns, the second photo resist pattern 108a cuts the portion of the first hard mask layer pattern 104a where the rounding is generated through the primarily lithography process. Therefore, the line edges of the second hard mask layer pattern 104b cannot have the rounding because the second hard mask layer pattern 104b is formed by using the second photo resist pattern 108a as an etching mask.

Figure 9A:
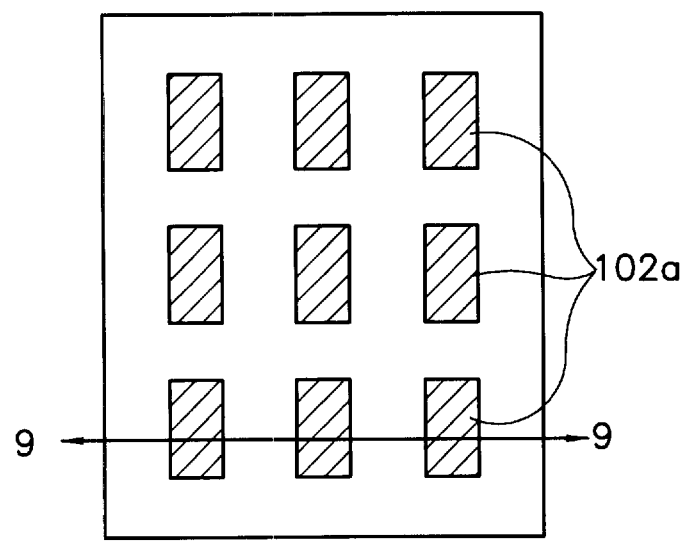
Figure 9B:
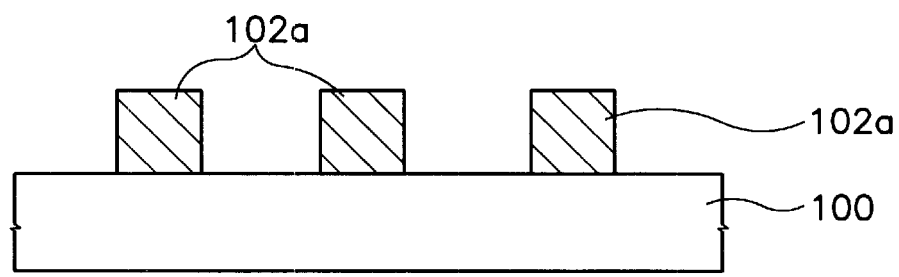

After the second hard mask layer pattern 104b is formed, the second photo resist pattern 108a is removed by ashing and striping processes. The layer 102 to be etched is then etched using the second hard mask layer pattern 104b as an etching mask. Subsequently, the second hard mask layer pattern 104b is removed by a developing process. FIG. 9A is plan view showing the resultant structure with the rectangular patterns 102a formed, after the layer 102 to be etched is etched. FIG. 9B is a cross-sectional view taken along line of 9—9 of FIG. 9A.

Figure 10A:
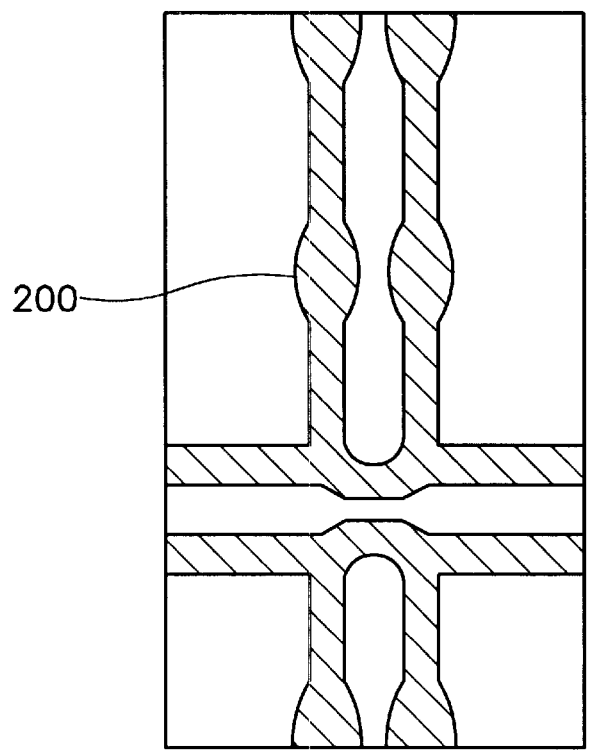
FIGS. 10A to 10C are plan views illustrating a method of forming a gate in a static random access memory device according to another embodiment of the present invention.
Figure 10B:
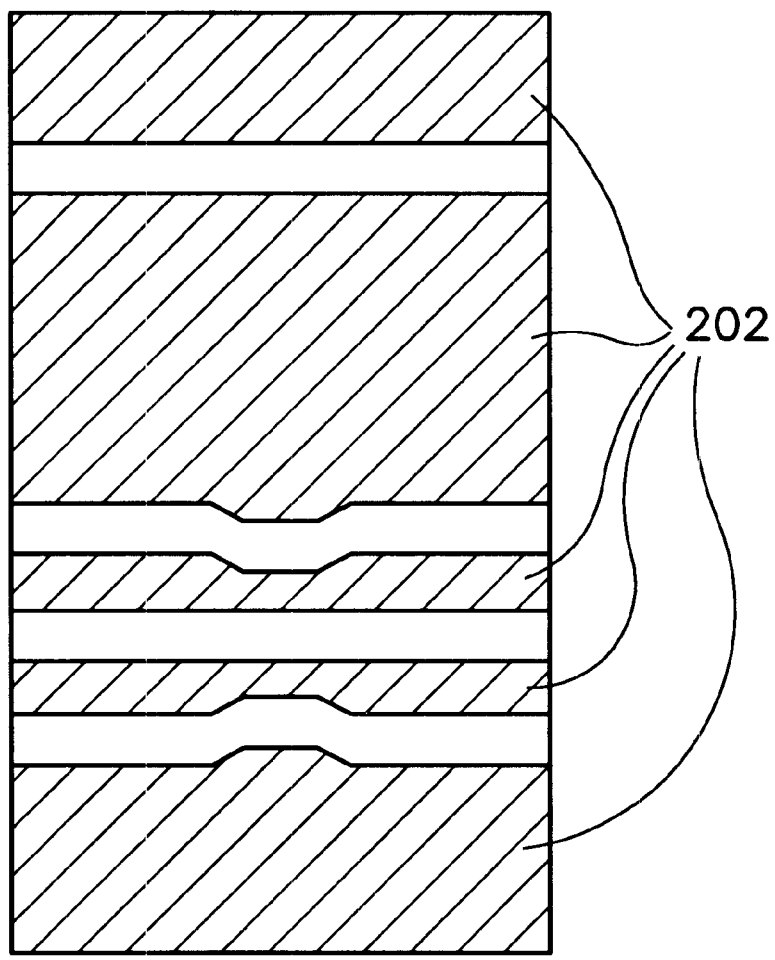
Figure 10C:
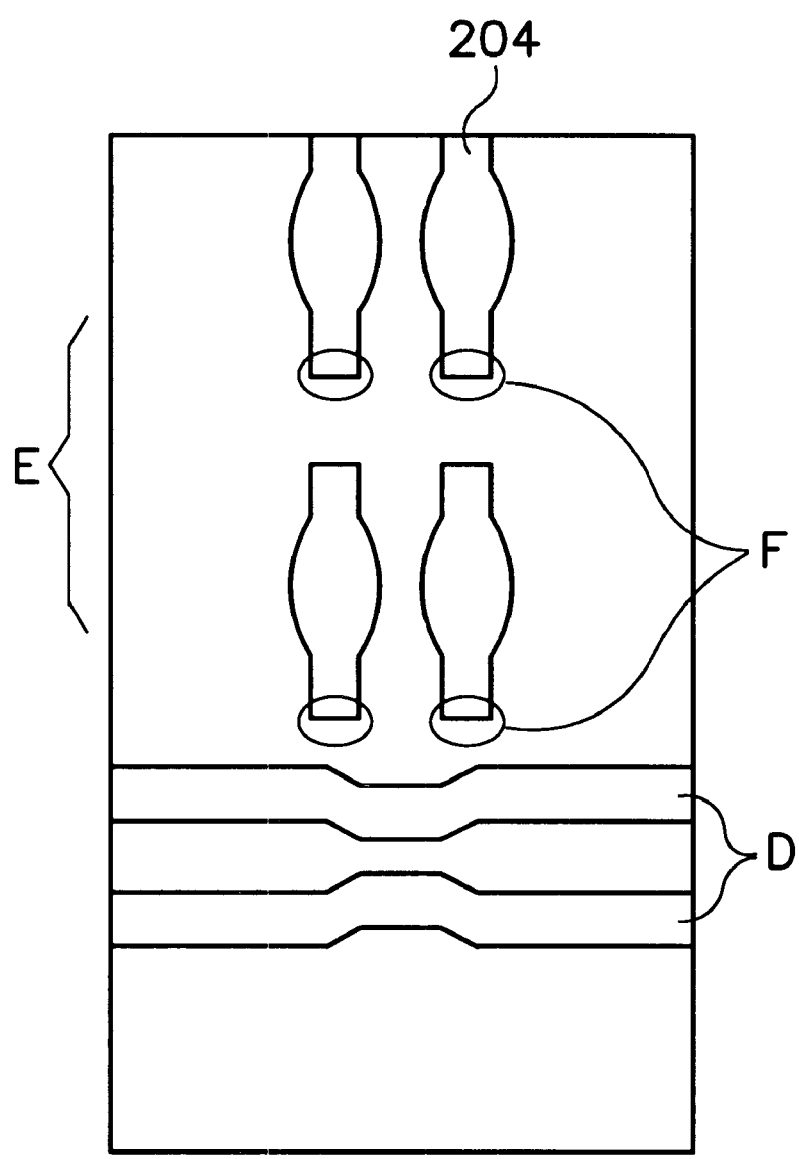

FIGS. 10A to 10C are plan views illustrating a method of forming the gate of a SRAM device according to another preferred embodiment of the present invention. In FIG. 10A, a first photo resist pattern 200 is formed during a primary photolithography process, and in FIG. 10B a second photo resist pattern 202 is formed during a secondary photolithography process. In FIG. 10C there is shown a gate pattern 204 formed using the first photo resist pattern 200 and the second photo resist pattern 202 as etching masks.

As shown in FIG. 10C, the gate pattern 204 of the SRAM device includes the line/space pattern D in one region and the island type pattern E in another region. Hence, the first photo resist pattern 200 and the second photo resist pattern 202 are patterned to form the line/space pattern in one region where the line/space pattern is not affected by the optical proximity effect. Also, the first photo resist pattern 200 and the second photo resist pattern 202 are employed perpendicular to each other in another region where the island type patterns will be formed. As the result, the island type pattern E having line edges (see 'F' in FIG. 10C) without rounding can be formed, and the gate pattern 204 having the island type pattern E and the line/space pattern D can be obtained.

As described above, according to the present invention, the hard mask layer is etched by the primarily photolithography process to form the first hard mask layer pattern, and then the hard mask layer is etched by the secondary photolithography process to form the second hard mask layer pattern. Therefore, rounding can be prevented through the double photo lithography process, and the latent image cannot overlap the second photo resist pattern since the second photo resist pattern is formed after the first photo resist pattern is removed.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method of forming fine patterns in a semiconductor device comprising:

forming a layer to be etched on a semiconductor substrate, said layer to be etched being used to form a main pattern;

forming a hard mask layer on said layer to be etched;

forming a first hard mask layer pattern, defining a first peripheral portion of said main pattern in a first direction, by patterning said hard mask layer;

forming a second hard mask layer pattern, defining the first and a second peripheral portions of said main pattern in the first direction and a second direction, by patterning said first hard mask layer pattern, said second hard mask layer pattern being identical to said main pattern; and forming said main pattern by etching said layer to be etched using said second hard mask layer pattern as a mask.

2. The method as claimed in claim 1, wherein said step of forming said first hard mask layer pattern comprises:

forming a first photo resist pattern on said hard mask layer, said first photo resist pattern corresponding to the first peripheral portion of said main pattern in the first direction; and etching said hard mask layer using said first photo resist pattern as a mask.

3. The method as claimed in claim 1, wherein said step of forming said second hard mask layer pattern comprises:

forming a second photo resist pattern on the resultant structure including said first hard mask layer pattern, said second photo resist pattern corresponding to the second peripheral portion of said main pattern in the second direction; and etching said first hard mask layer pattern using said second photo resist pattern as a mask.

4. The method as claimed in claim 1, wherein said hard mask layer is comprised of a material having an etching selectivity higher than that of said layer to be etched during an etching process.

5. The method as claimed in claim 4, wherein said hard mask layer is one selected from the group consisting of silicon oxide ($SiO_2$), silicon nitride ($Si_xN_y$) and silicon oxynitride ($SiO_xN_y$), and said layer to be etched is one selected from the group consisting of polysilicon and metal silicide.

6. The method as claimed in claim 1, wherein the second direction is perpendicular to the first direction.

7. A method of forming fine patterns in a semiconductor device comprising:

forming a layer to be etched on a semiconductor substrate, said layer to be etched being used to form a main pattern;

forming a hard mask layer on said layer to be etched;

coating a first photo resist layer on said hard mask layer;

forming a first photo resist pattern by using a first photo mask having a first light masking layer pattern extending in a first direction, and then exposing and developing said first photo resist layer;

forming a first hard mask layer pattern by etching said hard mask layer using said first photo resist pattern as a mask;

removing said first photo resist pattern;

coating a second photo resist layer on the resultant structure including said first hard mask layer pattern;

forming a second photo resist pattern by using a second photo mask having a second light masking layer pattern extending in a second direction perpendicular to the first direction, and then exposing and developing said second photo resist layer;

forming a second hard mask layer pattern identical to said main pattern by etching said first hard mask layer pattern using said second photo resist pattern as a mask;

removing said second photo resist pattern; and forming said main pattern by etching said layer to be etched using said second hard mask layer pattern as a mask.

8. The method as claimed in claim 7, wherein said hard mask layer is composed of a material having an etching selectivity higher than that of said layer to be etched during an etching process.

9. The method as claimed in claim 8, wherein said hard mask layer is one selected from the group consisting of silicon oxide ($SiO_2$), silicon nitride ($Si_xN_y$) and silicon oxynitride ($SiO_xN_y$), and said layer to be etched is one selected from the group consisting of polysilicon and metal silicide.

10. The method as claimed in claim 7, wherein said first photo mask and said second photo mask are identical to each other, and said second photo mask is obtained by rotating said first photo mask by an angle of about 90 degrees.

11. A method of forming fine patterns patterned to simultaneously form a line/space pattern and an island type pattern in a semiconductor device, comprising:

forming a layer to be etched on a semiconductor substrate, said layer to be etched being used to form a main pattern;

forming a hard mask layer on said layer to be etched;

forming a first photo resist pattern on said hard mask layer, said first photo resist pattern being patterned to form said line/space pattern in a first region where said line/space pattern is formed and extending along a first direction into a second region where said island pattern is formed;

forming a first hard mask layer pattern by etching said hard mask layer using said first photo resist pattern as a mask;

removing said first photo resist pattern;

forming a second photo resist pattern on the resultant structure including said first hard mask layer pattern, said second photo resist pattern being patterned to form said line/space pattern in the first region and extending into the second region along a second direction perpendicular to the first direction;

forming a second hard mask layer pattern identical to said main pattern by etching said first hard mask layer pattern using said second photo resist pattern as a mask;

removing said second photo resist pattern; and forming said main pattern by etching said layer to be etched using said second hard mask layer pattern as a mask.

12. The method as claimed in claim 11, wherein said hard mask layer is comprised of a material having an etching selectivity higher than that of said layer to be etched during an etching process.

13. The method as claimed in claim 12, wherein said hard mask layer is one selected from the group consisting of silicon oxide ($SiO_2$), silicon nitride ($Si_xN_y$) and silicon oxynitride ($SiO_xN_y$), and said layer to be etched is one selected from the group consisting of polysilicon and metal silicide.

* * * * *